United States Patent
Xu

(10) Patent No.: US 9,999,144 B2
(45) Date of Patent: Jun. 12, 2018

(54) DOUBLE-SHAFT HINGE AND ELECTRONIC DEVICE

(71) Applicant: Lenovo (Beijing) Co., Ltd., Beijing (CN)

(72) Inventor: Jun Xu, Beijing (CN)

(73) Assignee: Lenovo (Beijing) Co., Ltd., Beijing (CN)

(*) Notice: Subject to any disclaimer, the term of this patent is extended or adjusted under 35 U.S.C. 154(b) by 0 days. days.

(21) Appl. No.: 15/281,801

(22) Filed: Sep. 30, 2016

(65) Prior Publication Data
US 2017/0020010 A1 Jan. 19, 2017

Related U.S. Application Data

(63) Continuation of application No. 14/669,609, filed on Mar. 26, 2015, now Pat. No. 9,611,680.

(30) Foreign Application Priority Data

Sep. 3, 2014 (CN) .......................... 2014 1 0447317

(51) Int. Cl.
*H05K 5/02* (2006.01)
*E05D 3/12* (2006.01)
*G06F 1/16* (2006.01)

(52) U.S. Cl.
CPC ............. *H05K 5/0226* (2013.01); *E05D 3/12* (2013.01); *E05D 3/122* (2013.01); *G06F 1/1681* (2013.01);
(Continued)

(58) Field of Classification Search
CPC .. E05D 3/122; E05D 3/12; E05D 3/06; A47K 13/12; G06F 1/1618; G06F 1/1681; G06F 1/162; G06F 1/1616; G06F 1/1633; E05Y 2900/606
USPC ............ 361/679.01, 679.02, 679.06, 679.09, 361/679.27, 679.55; 16/281, 282, 294, 16/302, 354, 356, 365, 366; 455/575.1, 455/575.3
See application file for complete search history.

(56) References Cited

U.S. PATENT DOCUMENTS 8,474,101 B2 7/2013 Wang et al.
9,201,464 B2 12/2015 Uchiyama et al.
(Continued)

*Primary Examiner* — Steven T Sawyer
*Assistant Examiner* — Sagar Shrestha
(74) *Attorney, Agent, or Firm* — Harness, Dickey & Pierce, P.L.C.

(57) ABSTRACT

A double-shaft hinge and an electronic device are provided. The double-shaft hinge includes a transmission device, and a first rotation shaft and a second rotation shaft in parallel with each other. The transmission device includes a first transmission member sleeved on the first rotation shaft and circumferentially fixed on the first rotation shaft, a second transmission member sleeved on the second rotation shaft and circumferentially fixed on the second rotation shaft, and a third transmission member. The third transmission member is arranged between the first transmission member and the second transmission member, and has one end engaged with the first transmission member, and another end engaged with the second transmission member. The first transmission member and the second transmission member are connected by the third transmission member to be rotatable with respect to each other in opposite directions simultaneously.

5 Claims, 7 Drawing Sheets

(52) U.S. Cl.
CPC ....... *E05Y 2900/606* (2013.01); *G06F 1/1618* (2013.01)

(56) References Cited

U.S. PATENT DOCUMENTS

| | | | |
|---|---|---|---|
| 9,310,850 B2 | 4/2016 | Hsu | |
| 9,342,101 B2 | 5/2016 | Hsu | |
| 9,464,471 B1* | 10/2016 | Chen | G06F 1/1681 |
| 9,606,578 B2* | 3/2017 | Yuan | G06F 1/1616 |
| 2009/0070961 A1 | 3/2009 | Chung et al. | |
| 2010/0283367 A1* | 11/2010 | Coleman | E05D 3/022 |
| | | | 312/405 |
| 2011/0289728 A1* | 12/2011 | Wang | E05D 3/122 |
| | | | 16/337 |
| 2012/0042473 A1* | 2/2012 | Wang | G06F 1/1681 |
| | | | 16/319 |
| 2012/0096678 A1 | 4/2012 | Zhang et al. | |
| 2013/0322004 A1* | 12/2013 | Park | F16C 11/10 |
| | | | 361/679.27 |
| 2015/0159413 A1* | 6/2015 | Chen | E05D 3/122 |
| | | | 16/342 |
| 2015/0260230 A1 | 9/2015 | Xu | |
| 2015/0267450 A1* | 9/2015 | Chiang | G06F 1/1681 |
| | | | 16/354 |
| 2015/0342068 A1* | 11/2015 | Su | G06F 1/1681 |
| | | | 16/354 |
| 2015/0362958 A1* | 12/2015 | Shang | G06F 1/1681 |
| | | | 361/679.58 |
| 2016/0010374 A1* | 1/2016 | Hsu | G06F 1/16 |
| | | | 74/414 |
| 2016/0011632 A1* | 1/2016 | Hsu | E05D 3/122 |
| | | | 16/354 |
| 2016/0102487 A1 | 4/2016 | Kuramochi | |

* cited by examiner

DOUBLE-SHAFT HINGE AND ELECTRONIC DEVICE

This application is continuation of U.S. patent application Ser. No. 14/669,609 filed on Mar. 26, 2015, which claims the benefit of priority to Chinese Patent Application No. 201410447317.X titled "DOUBLE-SHAFT HINGE AND ELECTRONIC DEVICE", filed with the Chinese State Intellectual Property Office on Sep. 3, 2014, the entire disclosure of which is incorporated herein by reference.

TECHNICAL FIELD

The present application relates to the technical field of hinges, and particularly to a double-shaft hinge and an electronic device having the double-shaft hinge.

BACKGROUND

An electronic device, such as a laptop or a foldable tablet computer, includes two parts connected to each other. The two parts are a first body with a screen and a second body with components of a host, and the first body and the second body are rotatably connected to each other by a double-shaft hinge. The first body and the second body can be connected by the double-shaft hinge to be rotatable with respect to each other in opposite directions simultaneously.

The double-shaft hinge has a few structural forms, which leaves a user a few choices, and there are a few types of the double-shaft hinges.

SUMMARY

According to one aspect, a double-shaft hinge is provided according to the present application, which includes a first rotation shaft and a second rotation shaft in parallel with each other, and a transmission device, the transmission device includes a first transmission member fixed on the first rotation shaft; a second transmission member fixed on the second rotation shaft; and a third transmission member arranged between the first transmission member and the second transmission member; wherein the first transmission member and the second transmission member are rotatable with respect to each other in opposite directions simultaneously via the third transmission member.

According to another aspect, an electronic device is provided according to the present application, which includes a first body and a second body, and a double-shaft hinge; the double-shaft hinge includes a first rotation shaft and a second rotation shaft in parallel with each other, and a transmission device; the transmission device includes a first transmission member fixed on the first rotation shaft; a second transmission member fixed on the second rotation shaft; and a third transmission member arranged between the first transmission member and the second transmission member; wherein the first transmission member and the second transmission member are rotatable with respect to each other in opposite directions simultaneously via the third transmission member.

DETAILED DESCRIPTION

Figure 1:
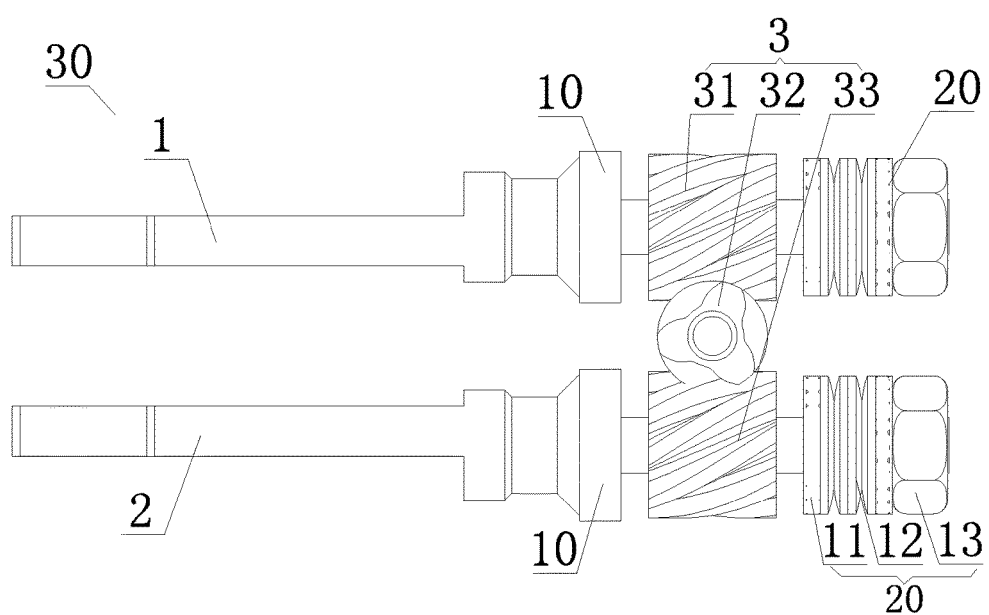
FIG. 1 is an assembly structural schematic view of a double-shaft hinge according to an embodiment of the present application.

For further illustrating the technical means and the effects of the present application, the embodiments, structures, features and effects of the present application will be described in detail in conjunction with drawings and preferred embodiments hereinafter. In the following description, "an embodiment" or "the embodiment" appeared at different positions may not refer to a same embodiment. In addition, the specific features, structures, or characteristics in one or more embodiments may be combined in any form.

As shown in FIG. 1 to FIG. 6, a double-shaft hinge 30 according to an embodiment of the present application includes a first rotation shaft 1, a second rotation shaft 2, and a transmission device 3. The first rotation shaft 1 is in parallel with the second rotation shaft 2.

The transmission device 3 includes a first transmission member 31, a second transmission member 33, and a third transmission member 32. The first transmission member 31 is sleeved on the first rotation shaft 1 and is circumferentially fixed on the first rotation shaft 1, thereby allowing the first transmission member 31 to be rotatable along with the first rotation shaft 1. The second transmission member 33 is sleeved on the second rotation shaft 2 and is circumferentially fixed on the second rotation shaft 2, thereby allowing the second transmission member 33 to be rotatable along with the second rotation shaft 2. The third transmission member 32 is arranged between the first transmission member 31 and the second transmission member 33, and has one end engaged with the first transmission member 31 and another end engaged with the second transmission member 33.

The first transmission member 31 and the second transmission member 33 are connected by the third transmission member 32 to be rotatable with respect to each other in opposite directions simultaneously. The "be rotatable with respect to each other in opposite directions simultaneously" refers to that the first transmission member 31 and the second transmission member 33 can rotate simultaneously and the rotation directions of the first transmission member 31 and the second transmission member 33 are opposite. When the first transmission member 31 rotates clockwise, the second transmission member 33 rotates anticlockwise; and when the first transmission member 31 rotates anticlockwise, the second transmission member 33 rotates clockwise.

The double-shaft hinge 30 according to the embodiment of the present application provides more choices for users, and enriches the type of the double-shaft hinge.

Figure 2:
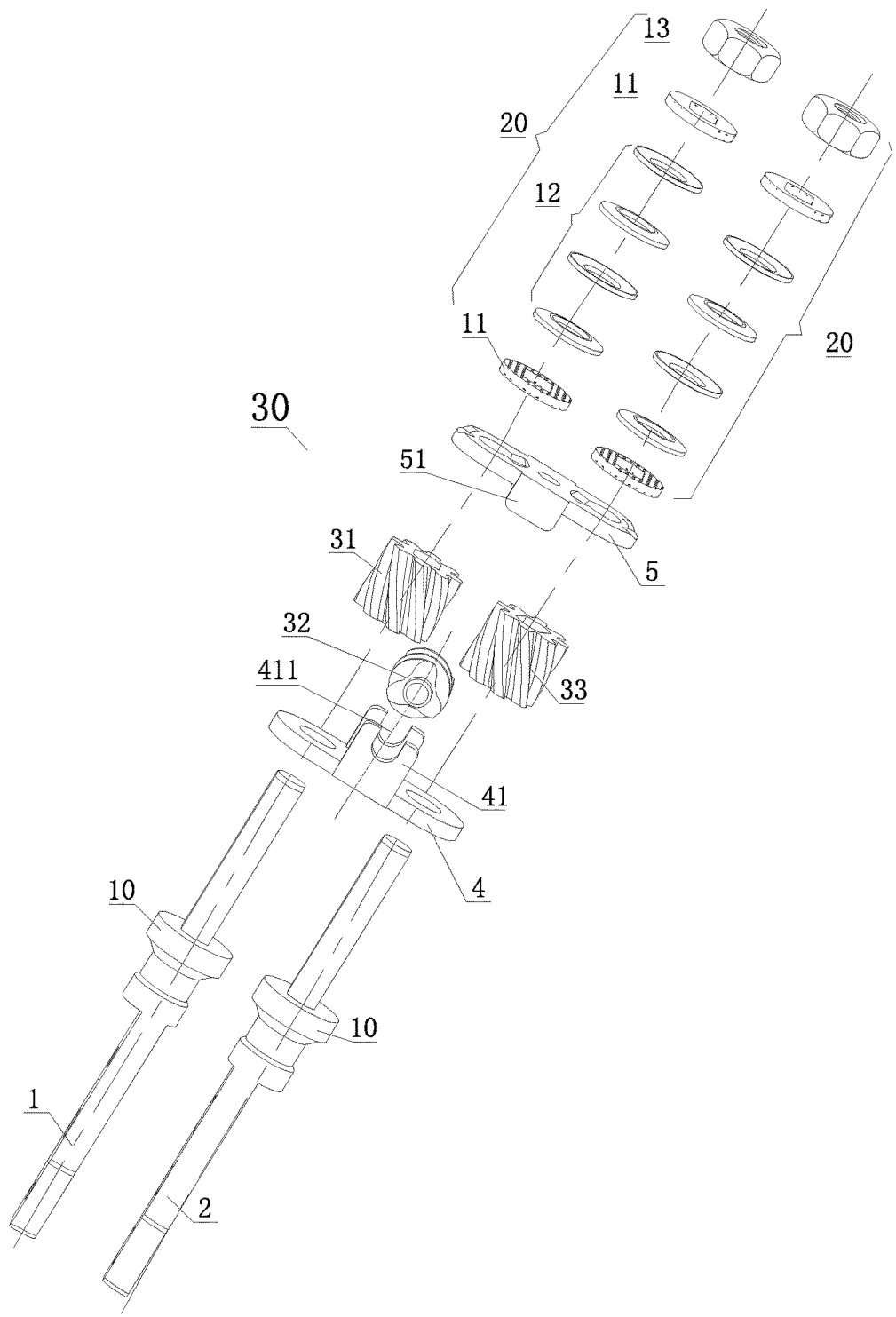
FIG. 2 is an exploded structural schematic view of the double-shaft hinge in FIG. 1, wherein the first connection member and the second connection member are shown.

Further, for achieving the function of the transmission device 3, a solution is further provided hereinafter. As shown in FIGS. 1 and 2, the first transmission member 31 is a first worm gear, the second transmission is a second worm gear, and the third transmission member 32 is a worm. The worm includes an axle, and the axle of the worm is perpendicular to the first rotation shaft 1 and the second rotation shaft 2. The transmission device 3 in this embodiment is a worm and worm gear transmission mechanism, and the first worm gear and the second worm gear are connected by the worm to be rotatable with respect to each other in opposite directions simultaneously.

Further, for arranging the worm between the first worm gear and the second worm gear, a solution is further provided according to the present application hereinafter. As shown in FIG. 2, the double-shaft hinge 30 further includes a first connection member 4. The first rotation shaft 1 and the second shaft 2 pass through the first connection member 4, respectively, and both of the first rotation shaft 1 and the second rotation shaft 2 are rotatable with respect to the first connection member 4. Two via holes are provided on the first connection member 4, and a diameter of each via hole is greater than outer diameters of the first rotation shaft 1 and the second rotation shaft 2. When the first connection member 4 is immobilized, each of the first rotation shaft 1 and the second rotation shaft 2 is rotatable with respect to the first connection member 4 in the respective via hole. The first connection member 4 is provided with a support frame 41, and the axle of the worm is rotatably mounted on the support frame 41. In this embodiment, each of the first connection member 4 and the support frame 41 is in the shape of a plate, and the first connection member 4 and the support frame 41 are formed integrally. Certainly, in other embodiments, the support frame 41 may also be an individual member, which can be fixed to the first connection member 4 by screws, or other members. The manner of forming the support frame 41 and the first connection member 4 can be set according to the actual requirements of the user.

Further, to allow the axle of the worm to be rotatably mounted on the support frame 41, a solution is further provided according to the present application hereinafter. As shown in FIG. 2, the double-shaft hinge 30 further includes a second connection member 5, and the first rotation shaft 1 and the second rotation shaft 2 pass through the second connection member 5, and both of the first rotation shaft 1 and the second rotation shaft 2 are rotatable with respect to the second connection member 5. Two via holes are provided on the second connection member 5, and a diameter of each via hole is greater than outer diameters of the first rotation shaft 1 and the second rotation shaft 2. When the second connection member 5 is immobilized, each of the first rotation shaft 1 and the second rotation shaft 2 is rotatable with respect to the second connection member 5 in the respective via hole.

Both of the first worm gear and the second worm gear are arranged between the first connection member 4 and the second connection member 5. Specifically, both of the first worm gear and the second worm gear are sandwiched between the first connection member 4 and the second connection member 5.

The support frame 41 is provided with a groove 411, and the axle of the worm is mounted in the groove 411 and rotatably cooperates with the groove 411. The axle of the worm is rotatable in the groove 411. The second connection member 5 is provided with a protrusion 51 to limit the axle of the worm to rotate in the groove 411. In this embodiment, the protrusion 51 abuts against the support frame 41, and the protrusion 51 closes an opening of the groove 411, thus, the groove 411 and the protrusion 51 cooperate with each other to form an axle hole. The protrusion 51 can prevent the axle of the worm from sliding out of the groove 411 and allow the axle of the worm to be rotatable in the groove 411. The first connection member 4 and the second connection member 5 cooperate with each other to mount and fix the worm, which facilitates assembling and disassembling the worm.

Further, to allow the axle of the worm to be rotatably mounted on the support frame 41, a solution is further provided according to the present application hereinafter. The support frame 41 is provided with an axle hole, and the axle of the worm is mounted in the axle hole and rotatably cooperates with the axle hole. In this embodiment, the support frame 41 and the first connection member 4 are both a plastic member, and the support frame 41 is slightly elastic. In assembling the worm, the support frame 41 is bent to one side to generate a certain gap, to allow the axle of the worm to be assembled into the axle hole on the support frame 41 conveniently. The specific manner is not limited to this embodiment and can be set according to the actual requirements of the user.

Further, to fix the position of each of the first worm gear and the second worm gear on the respective rotation shaft, a solution is further provided according to the present application hereinafter. The first worm gear has one end abutting against the first connection member 4, and another end abutting against the second connection member 5. The second worm gear has one end abutting against the first connection member 4, and another end abutting against the second connection member 5. Specifically, the first connection member 4 and the second connection member 5 are configured to sandwich the first worm gear and the second worm gear therebetween, to fix the positions of the first worm gear and the second worm gear, prevent each of the first worm gear and the second worm gear from sliding on the respective rotation shaft, thereby improving the transmission accuracy of the first worm gear and the second worm gear.

Figure 3:
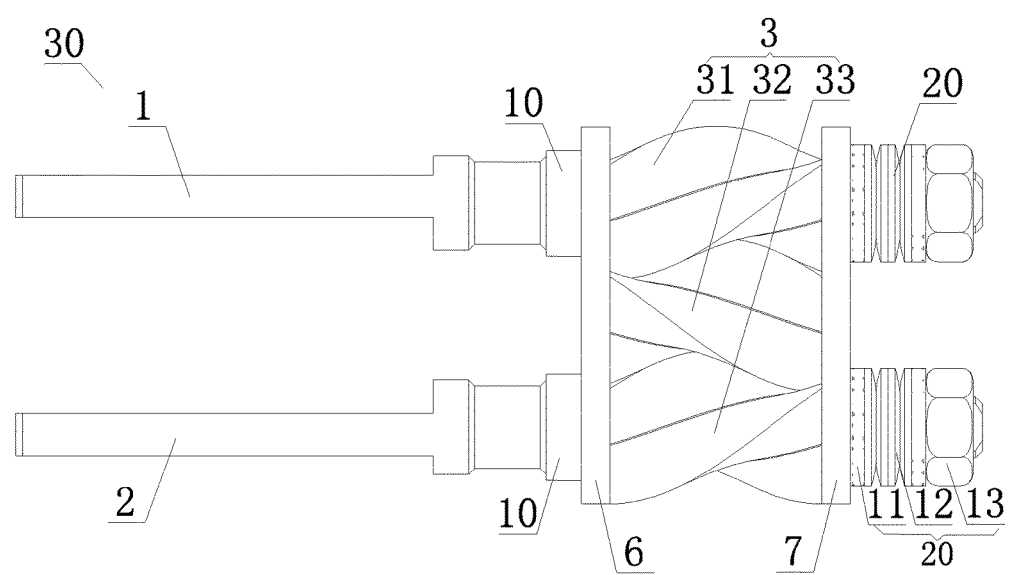
FIG. 3 is an assembly structural schematic view of another double-shaft hinge according to an embodiment of the present application.
Figure 4:
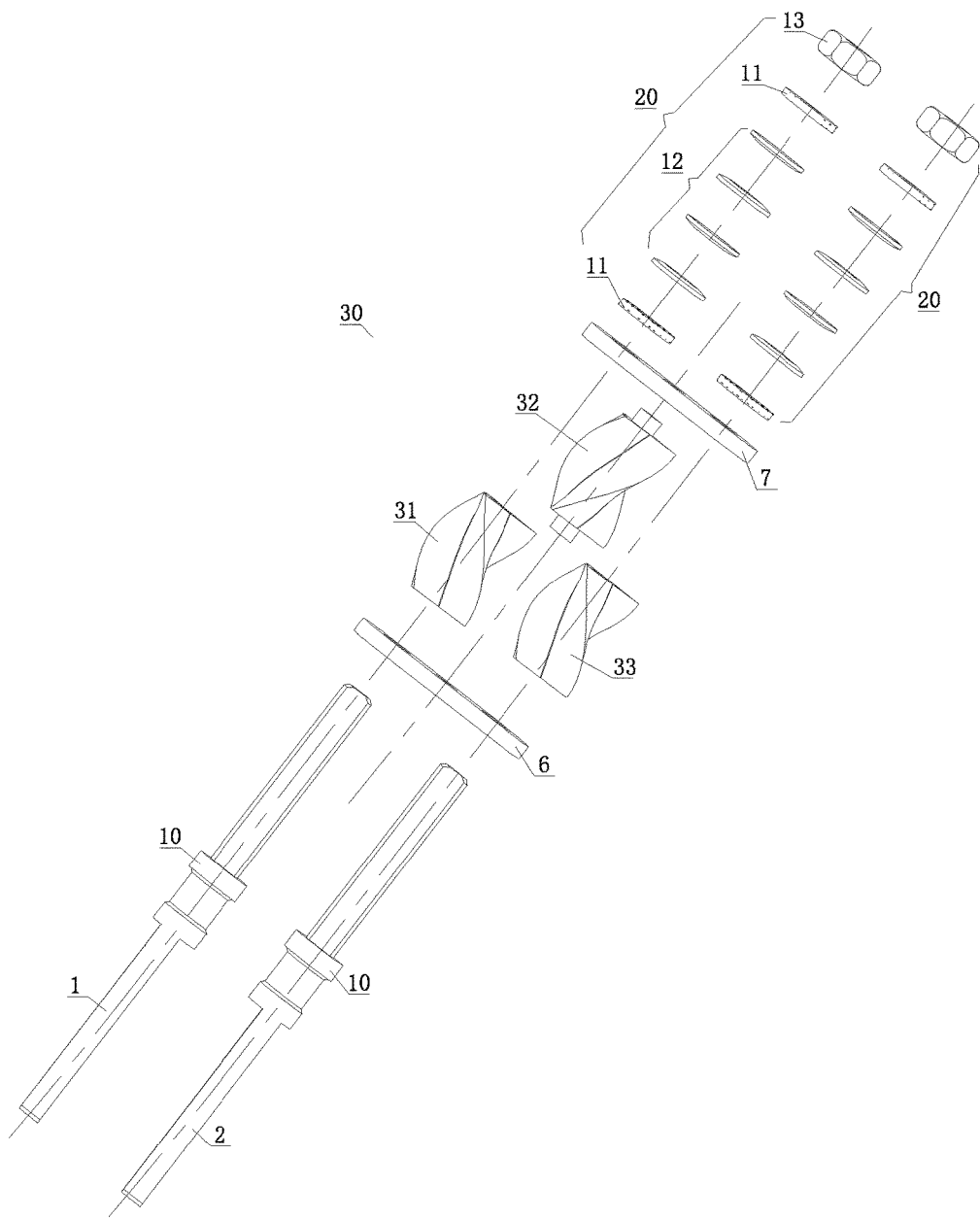
FIG. 4 is an exploded structural schematic view of the double-shaft hinge in FIG. 3.

Further, to achieve the function of the transmission device 3, a solution is further provided according to the present application hereinafter. As shown in FIG. 3 and FIG. 4, the first transmission member 31 is a first spiral gear, the second transmission member 33 is a second spiral gear, and the third transmission gear 32 is a third spiral gear. The third spiral gear includes an axle, and the axle of the third spiral gear is in parallel with the first rotation shaft 1 and the second rotation shaft 2. The first spiral gear and the second spiral gear are connected by the third spiral gear to be rotatable with respect to each other in opposite directions simultaneously.

Further, to arrange the third spiral gear between the first spiral gear and the second spiral gear, a solution is further provided according to the present application hereinafter. As shown in FIG. 3 and FIG. 4, the double-shaft hinge 30 further includes a third connection member 6 and a fourth connection member 7.

The first rotation shaft 1 passes through the third connection member 6 and the fourth connection member 7 in turn, and the first rotation shaft 1 is rotatable with respect to both the third connection member 6 and the fourth connection member 7. Each of the third connection member 6 and the fourth connection member 7 is provided with a via hole allowing the first rotation shaft 1 to pass through, and a diameter of the via hole of each of the third connection member 6 and the fourth connection member 7 is greater than the outer diameter of the first rotation shaft 1. When the third connection member 6 and the fourth connection member 7 are immobilized, the first rotation shaft 1 is rotatable with respect to both the third connection member 6 and the fourth connection member 7.

The second rotation shaft 2 passes through the third connection member 6 and the fourth connection member 7 in turn, and the second rotation shaft 2 is rotatable with respect to both the third connection member 6 and the fourth connection member 7. Each of the third connection member 6 and the fourth connection member 7 is provided with a via hole allowing the second rotation shaft 2 to pass through, and a diameter of the via hole of each of the third connection member 6 and the fourth connection member 7 is greater than the outer diameter of the second rotation shaft 2. When the third connection member 6 and the fourth connection member 7 are immobilized, the second rotation shaft 2 is rotatable with respect to both the third connection member 6 and the fourth connection member 7.

Both of the first spiral gear and the second spiral gear are arranged between the third connection member 6 and the fourth connection member 7. Both of the third connection member 6 and the fourth connection member 7 are sandwiched between the first spiral gear and the second spiral gear.

Each of the third connection member 6 and the fourth connection member 7 is provided with a first axle hole (not shown), and the axle of the third spiral gear is mounted in the first axle holes and rotatably cooperates with the first axle holes. When the first spiral gear rotates, the second spiral gear can be rotated by the first spiral gear via the third spiral gear.

Further, as shown in FIG. 3 and FIG. 4, the first spiral gear has one end abutting against the third connection member 6, and another end abutting against the fourth connection member 7. The second spiral gear has one end abutting against the third connection member 6, and another end abutting against the fourth connection member 7. The third connection member 6 and the fourth connection member 7 are configured to sandwich the first spiral gear and the second spiral gear therebetween, to fix the positions of the first spiral gear and second spiral gear, and prevent each of the first spiral gear and the second spiral gear from sliding on the respective rotation shaft, thereby improving the transmission accuracy of the first spiral gear and the second spiral gear.

Figure 5:
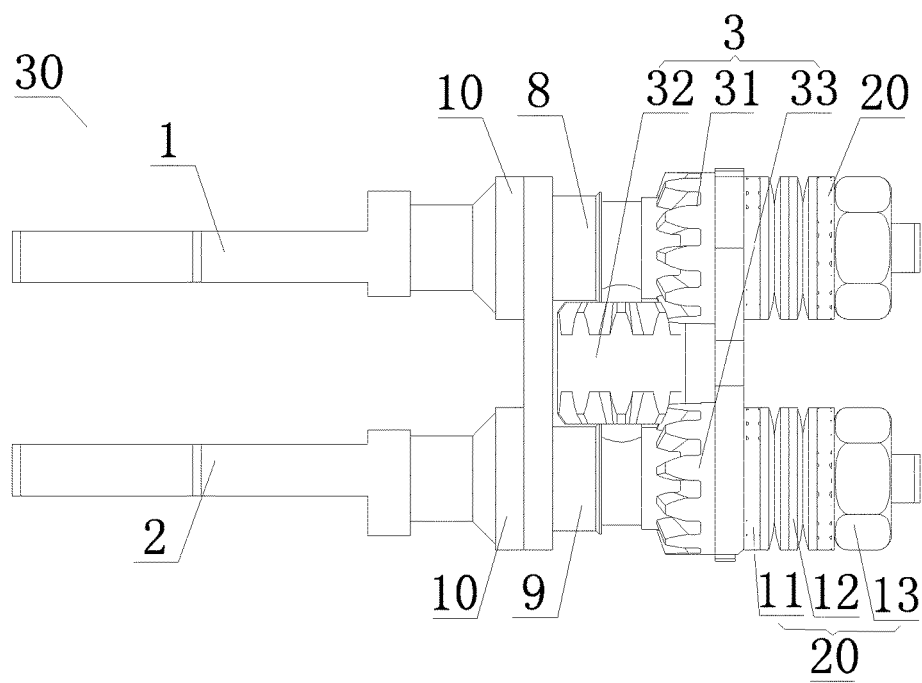
FIG. 5 is an assembly structural schematic view of another double-shaft hinge according to an embodiment of the present application.
Figure 6:
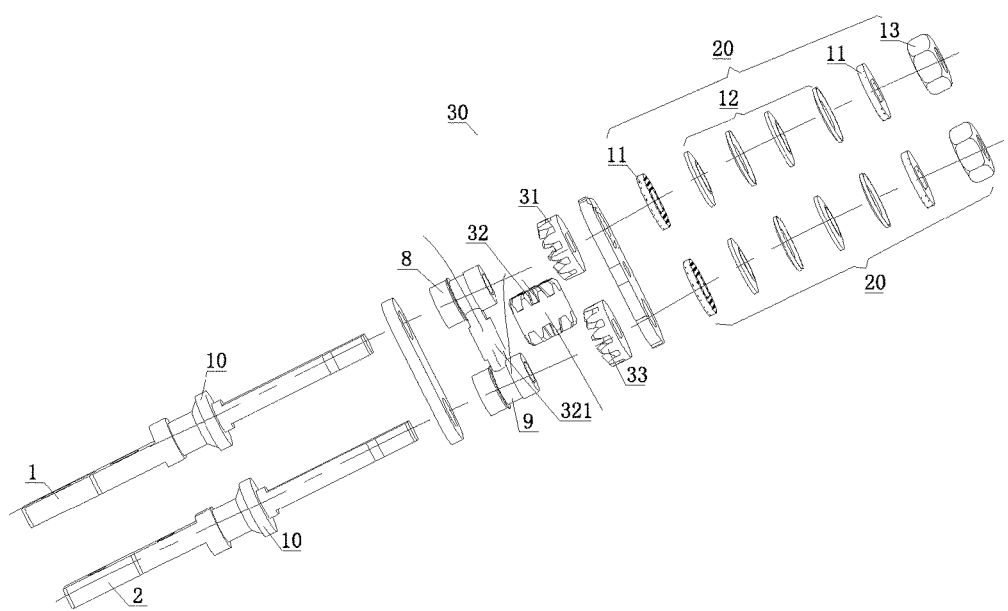
FIG. 6 is an exploded structural schematic view of the double-shaft hinge in FIG. 5.

Further, to achieve the function of the transmission device 3, a solution is further provided according to the present application hereinafter. As shown in FIG. 5 and FIG. 6, the first transmission member 31 is a first helical gear, the second transmission member 33 is a second helical gear, and the third transmission member 32 is a third helical gear. The third helical gear is provided with an axle, and the axle 321 of the third helical gear is perpendicular to the first rotation shaft 1 and the second rotation shaft 2. As shown in FIG. 5, the axle 321 of the third helical gear is perpendicular to a horizontal plane, and the first rotation shaft 1 and the second rotation shaft 2 are arranged in the horizontal direction. The transmission device 3 in this embodiment is a helical gear transmission mechanism. The first helical gear and the second helical gear are connected by the third helical gear to be rotatable with respect to each other in opposite directions simultaneously.

Further, to mount the third helical gear between the first helical gear and the second helical gear, a solution is further provided according to the present application hereinafter. As shown in FIG. 5 and FIG. 6, the double-shaft hinge 30 further includes a first shaft sleeve 8 and a second shaft sleeve 9. The first shaft sleeve 8 is sleeved on the first rotation shaft 1 and is rotatable with respect to the first rotation shaft 1, and the second shaft sleeve 9 is sleeved on the second rotation shaft 2 and is rotatable with respect to the second rotation shaft 2. An inner diameter of the first shaft sleeve 8 is greater than the outer diameter of the first rotation shaft 1, and the first rotation shaft 1 is rotatable with respect to the first shaft sleeve 8. An inner diameter of the second shaft sleeve 9 is greater than the outer diameter of the second rotation shaft 2, and the second rotation shaft 2 is rotatable with respect to the second shaft sleeve 9.

The axle 321 of the third helical gear has one end mounted on the first shaft sleeve 8, and another end mounted on the second shaft sleeve 9, and the third helical gear is rotatable with respect to both the first shaft sleeve 8 and the second shaft sleeve 9 via the axle thereof. An upper end of the third helical gear is engaged with the first helical gear, and a lower end of the third helical gear is engaged with the second helical gear.

Further, to allow the third helical gear to be rotatable with respect to the first shaft sleeve 8 and the second shaft sleeve 9 via the axle, a solution is further provided according to the present application hereinafter. As shown in FIG. 6, the third helical gear is provided with a second axle hole, and the axle of the third helical gear is mounted in the second axle hole and rotatably cooperates with the second axle hole, to allow the third helical gear to be rotatable with respect to the axle, which further allows the third helical gear to be rotatable with respect to both the first shaft sleeve 8 and the second shaft sleeve 9.

Certainly, in other embodiments, to allow the third helical gear to be rotatable with respect to the first shaft sleeve 8 and the second shaft sleeve 9 via the axle, a solution is further provided according to the present application hereinafter. The axle 321 of the third helical gear and the third helical gear are formed integrally. Each of the first shaft sleeve 8 and the second shaft sleeve 9 is provided with an axle hole, and the axle 321 of the third helical gear is mounted in the axle holes and rotatably cooperates with the axle holes, to allow the third helical gear to be rotatable with respect to both the first shaft sleeve 8 and the second shaft sleeve 9.

Further, to fix the positions of the first rotation shaft 1 and the second rotation shaft 2 after being rotated, a solution is further provided according to the present application hereinafter. As shown in FIG. 1 to FIG. 6, the double-shaft hinge 30 further includes two locating assemblies 20. One of the locating assemblies 20 are sleeved on the first rotation shaft 1, and the other of the locating assemblies 20 are sleeved on the second rotation shaft 2. The locating assemblies 20 are provided for fixing the positions of the first rotation shaft 1 and the second rotation shaft 2 after being rotated.

Each of the first rotation shaft 1 and the second rotation shaft 2 includes a shaft shoulder 10. The transmission device 3 is arranged between the locating assemblies 20 and the shaft shoulders 10. One side of the transmission device 3 abuts against the locating assemblies 20, and another side thereof abuts against the shaft shoulders 10. The transmission device 3 is tightly sandwiched between the shaft shoulders 10 and the locating assemblies 20 at a middle of the rotation shafts.

Further, to achieve the function of the locating assemblies 20, a solution is further provided according to the present application hereinafter. As shown in FIG. 1 to FIG. 6, each of the locating assemblies 20 includes a fixing member 13, at least two gaskets 11, and at least one elastic member 12. The gaskets 11 are sleeved on the rotation shaft (the first rotation shaft 1 and the second rotation shaft 2) and are circumferentially fixed on the rotation shaft, to allow the gaskets to be rotatable along with the rotation shaft. The elastic member 12 is sleeved on the rotation shaft (the first rotation shaft 1 and the second rotation shaft 2) and is rotatable with respect to the rotation shaft. An inner diameter of the elastic member 12 is greater than the outer diameter of the rotation shaft, and the elastic member 12 is sleeved on the outer surface of the rotation shaft and is rotatable with respect to the rotation shaft. The elastic member 12 is arranged between two adjacent gaskets 11. The fixing member 13 is sleeved on the outmost end of the rotation shaft and is detachably connected to the rotation shaft. The fixing member 13 is configured to supply a force to both the gaskets 11 and the elastic member 12, to maintain the gaskets 11 and the elastic member 12 to abut against each other. The "detachably connected" refers to that the fixing member 13 can be fixed to the rotation shaft, and can be detached from the rotation shaft.

In the locating assembly 20, adjacent two members abut against each other under the action of the fixing member 13. When the first rotation shaft 1 and the second rotation shaft 2 rotate to a certain position, the elastic member 12 provides a frictional resistance to the gaskets 11, and the frictional resistance fixes the gaskets 11 and the rotation shafts at the current position, thereby fixing the positions of the first rotation shaft 1 and the second rotation shaft 2 after being rotated.

The position of the fixing member 13 on the rotation shaft can be adjusted according to the requirements, to increase or decrease the frictional resistance between the elastic member 12 and the gaskets 11, thus the first rotation shaft 1 and the second rotation shaft 2 can have different tensions during the rotation. The fixing member 13 can be adjusted to an appropriate position according to the preference of the user.

Further, the elastic member 12 may be an elastic gasket, an elastic rubber, or an elastic silica gel, which can be set according to the actual requirements of the user.

Further, in this embodiment, the fixing member 13 is a nut, and the fixing member 13 is in threaded connection to the first rotation shaft 1 or the second rotation shaft 2. Certainly, in other embodiments, the fixing member 13 may also be a snap ring. The structure of the fixing member 13 is not limited to this embodiment and can be set according to the actual requirements of the user.

Figure 7:
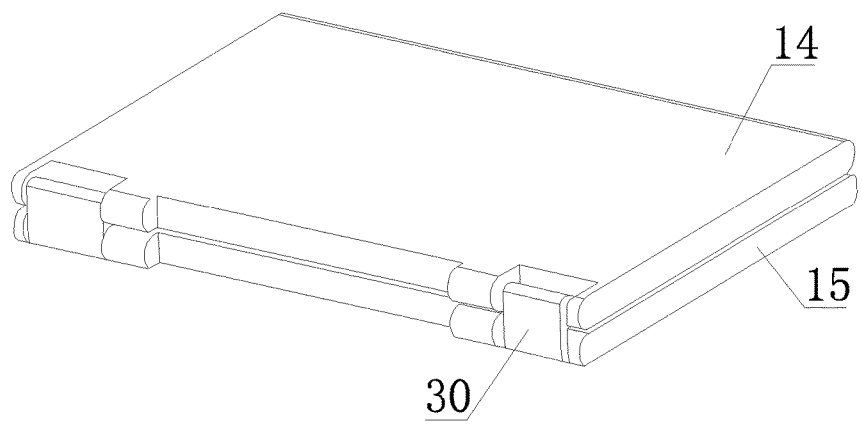
FIG. 7 is a perspective structural schematic view of an electronic device according to an embodiment of the present application.

As shown in FIG. 7, an electronic device is further provided according to an embodiment of the present application, which includes a first body 14, a second body 15, and any one of the above-described double-shaft hinges 30.

One end of the first rotation shaft 1 is circumferentially fixed on the first body 14, to allow the first rotation shaft 1 to be rotatable along with the first body 14. One end of the second rotation shaft 2 is circumferentially fixed on the second body 15, to allow the second rotation shaft 2 to be rotatable along with the second body 15. The first body 14 and the second body 15 are connected by the double-shaft hinge 30 to be rotatable with respect to each other in opposite directions simultaneously. When a user moves the first body 14 or the second body 15, the first body 14 and the second body 15 rotate with respect to each other in opposite directions simultaneously through the double-shaft hinge.

Further, the electronic device may be a laptop, a foldable tablet computer or a flip phone. The first body 14 may be a display or a tablet computer, and correspondingly, the second body 15 is a host or a keyboard, which can be set according to the actual requirements of the user.

The first transmission member is circumferentially fixed on the first rotation shaft, and the second transmission member is circumferentially fixed on the second rotation shaft, thus the first transmission member can rotate along with the first rotation shaft, and the second transmission member can rotate along with the second rotation shaft. The third transmission member is arranged between the first transmission member and the second transmission member, and one end of the third transmission member is engaged with the first transmission member, and the other end of the third transmission member is engaged with the second transmission member. When the first rotation shaft rotates, the third transmission member is rotated by the first transmission member on the first rotation shaft, and the second connection member and the second rotation shaft are rotated by the third transmission member. The first transmission member and the second transmission member are connected by the third transmission member to be rotatable with respect to each other in opposite direction simultaneously, thus the first rotation shaft and the second rotation shaft are also rotatable with respect to each other in opposite direction simultaneously. The first body and the second body of the electronic device may be connected by the double-shaft hinge to be rotatable with respect to each other in opposite direction simultaneously, thereby achieving the function of the double-shaft hinge. The double-shaft hinge provided by the present application provides more choices for users, and enriches the type of the double-shaft hinge.

The above described embodiments are only the preferred embodiments of the present application, and are not intend to limit the present application in any form. Any simple modifications, equivalent variations, and improvements made the above embodiments based on the technical essence of the present application shall fall into the scope of the technical solution of the present application.

What is claimed is:

1. A double-shaft hinge, comprising a first rotation shaft and a second rotation shaft in parallel with each other, and a transmission device, the transmission device comprising:
a first transmission member sleeved on the first rotation shaft and circumferentially fixed on the first rotation shaft;
a second transmission member sleeved on the second rotation shaft and circumferentially fixed on the second rotation shaft; and
a third transmission member arranged between the first transmission member and the second transmission member and having one end engaged with the first transmission member and another end engaged with the second transmission member; wherein the first transmission member and the second transmission member are rotatable with respect to each other in opposite directions simultaneously via the third transmission member; and wherein the first transmission member is a first helical gear, the second transmission member is a second helical gear, and the third transmission member is a third helical gear, and the third helical gear comprises an axle, and the axle of the third helical gear is perpendicular to the first rotation shaft and the second rotation shaft; and wherein, the double-shaft hinge further comprises:
two locating assemblies, wherein one of the locating assemblies is sleeved on the first rotation shaft, and the other of the locating assemblies is sleeved on the second rotation shaft, and the locating assemblies are configured for fixing positions of the first rotation shaft and the second rotation shaft after being rotated; and each of the first rotation shaft and the second rotation shaft comprises a shaft shoulder; the transmission device is arranged between the locating assemblies and the shaft shoulders, and one side of the transmission device abuts against the locating assemblies, and another side of the transmission device abuts against the shaft shoulders; and wherein each of the locating assemblies comprises:

at least two gaskets sleeved on the respective rotation shaft and circumferentially fixed on the respective rotation shaft;

at least one elastic member sleeved on the respective rotation shaft and rotatable with respect to the respective rotation shaft, and the elastic member is arranged between two adjacent gaskets; and a fixing member sleeved on an outmost end of the respective rotation shaft and detachably connected to the respective rotation shaft, wherein the fixing member is configured to supply a force to the at least two gaskets and the at least one elastic member and to maintain the at least two gaskets and the at least one elastic member to abut against each other; and the double-shaft hinge further comprises:

a first shaft sleeve and a second shaft sleeve, wherein the first shaft sleeve is sleeved on the first rotation shaft and is rotatable with respect to the first rotation shaft, and the second shaft sleeve is sleeved on the second rotation shaft and is rotatable with respect to the second rotation shaft; and the axle of the third helical gear has one end mounted on the first shaft sleeve and another end mounted on the second shaft sleeve, and the third helical gear is rotatable with respect to the first shaft sleeve and the second shaft sleeve through the axle.

2. An electronic device, comprising a first body, a second body, and the double-shaft hinge according to claim 1, and wherein one end of the first rotation shaft is circumferentially fixed on the first body, and one end of the second rotation shaft is circumferentially fixed on the second body, and the first body and the second body are rotatable with respect to each other in opposite directions simultaneously via the double-shaft hinge.

3. The electronic device according to claim 2, wherein the electronic device is a laptop, a foldable tablet computer, or a flip phone.

4. The electronic device according to claim 2, wherein the third helical gear is provided with a second axle hole, and the axle of the third helical gear is mounted in the second axle hole and rotatably cooperates with the second axle hole.

5. The double-shaft hinge according to claim 1, wherein the third helical gear is provided with a second axle hole, and the axle of the third helical gear is mounted in the second axle hole and rotatably cooperates with the second axle hole.

* * * * *